United States Patent [19]

Ward-Close et al.

[11] Patent Number: 5,378,500
[45] Date of Patent: Jan. 3, 1995

[54] METHOD OF MAKING PRECURSORS AND ARTICLES OF CERAMIC-REINFORCED METAL MATRIX COMPOSITES

[75] Inventors: Charles M. Ward-Close, Hampshire; Peter G. Partridge, Bristol, both of England

[73] Assignee: The Secretary of State for Defence in Her Britannic Majesty's Government of the United Kingdom of Great Britain and Northern Ireland, United Kingdom

[21] Appl. No.: 25,382

[22] Filed: Mar. 2, 1993

[51] Int. Cl.⁶ .............................................. C23C 16/00
[52] U.S. Cl. .................................. 427/250; 427/249; 427/255; 427/255.7; 427/566; 427/585; 204/192.1
[58] Field of Search ............ 427/249, 250, 255, 255.7, 427/566, 585; 204/192.1

[56] References Cited

U.S. PATENT DOCUMENTS

| | | | |
|---|---|---|---|
| 4,132,828 | 1/1979 | Nakamura et al. | 428/366 |
| 4,619,865 | 10/1986 | Keem et al. | 428/333 |
| 4,786,566 | 11/1988 | Siemers | 428/568 |
| 4,853,294 | 8/1989 | Everett et al. | 428/614 |
| 5,079,039 | 1/1992 | Heraud et al. | 427/249 |
| 5,244,748 | 9/1993 | Weeks, Jr. et al. | 427/250 |

FOREIGN PATENT DOCUMENTS

| | | |
|---|---|---|
| 0170359 | 2/1986 | European Pat. Off. . |
| 0434299A1 | 12/1990 | European Pat. Off. . |
| WO92/14860 | 9/1992 | European Pat. Off. . |
| 55-00427 | 1/1980 | Japan . |
| 2219006A | 11/1989 | United Kingdom . |
| 2237031A | 4/1991 | United Kingdom . |
| 2237031 | 4/1991 | United Kingdom . |

*Primary Examiner*—Shrive Beck
*Assistant Examiner*—David M. Maiorana
*Attorney, Agent, or Firm*—Nixon & Vanderhye

[57] ABSTRACT

Precursors for metal matrix composites are produced by coating a long fibre ceramic reinforcement with alternating layers of dissimilar species of matrix materials to an aggregate thickness sufficient to yield the intended matrix volume fraction in a consolidated product without additional material. This duplex coating of fibres is performed by vapor phase deposition comprising vapor condensation, sputtering or chemical vapor reaction. The precursor includes an aggregate coating of at least 5% of fibre diameter, preferably at least 20%. Various duplex systems are disclosed, each having one component significantly more frangible than the other to render damage tolerant properties to the resultant metal composite.

Product materials are produced from the duplex matrix coated fibres by consolidation of an assembly of coated fibres under conditions of elevated temperature and pressure to cause inter-fibre matrix flow and bonding of matrix materials.

14 Claims, 3 Drawing Sheets

(x 550 scale)

(x 330 scale)

METHOD OF MAKING PRECURSORS AND ARTICLES OF CERAMIC-REINFORCED METAL MATRIX COMPOSITES

BACKGROUND OF THE INVENTION

1. Field of the Invention

This invention relates to a method of making precursors and products of structural metal matrix composites having a long-fibre ceramic reinforcement, for use in applications requiring improved damage tolerance compared with current metal matrix composites.

The term "structural composite" is used herein in the context of material applications where suitability for function is judged on the physical strength and toughness properties such as tensile strength, proof stress, elastic modulus, ductility and damage tolerance and possibly density and resistance to corrosion under service conditions.

2. Discussion of Prior Art

Ceramic reinforcement fibres are used in metal matrix composites for structural applications in order to add strength or stiffness to the matrix metal. Such structural composite materials are of potential interest in a variety of aerospace applications embracing both airframe and engine components. Aluminum, titanium and nickel based alloys could all be used for the matrix material in appropriate applications where some improvement is sought over the properties offered by unreinforced monolithic material. Typical material targets might be high temperature titanium alloy turbine blades, and high stiffness lightweight aluminum alloy airframe components or aircraft skins.

Conventionally, long fibre reinforced metal matrix composites for structural applications are produced either by consolidation of a fibre/foil or fibre/powder preproduct or else by liquid metal infiltration of a fibre preproduct. These production routes do not lend themselves to the production of metal matrix composites with complex geometry. It is known to use a barrier layer or layers upon ceramic fibres to limit reaction with a matrix metal such as titanium. The prior art also includes proposals to place a single layer of dissimilar material between reinforcement and matrix to achieve a better sharing of load between the two. Neither reaction barrier layers or load transfer layers are intended to impart any structural attribute to the composite other than the effect which they exert on the reinforcement/matrix interface. They do not alter in any way the damage tolerance properties of the matrix as the present invention seeks to do.

In some prior art materials, sheets of monolithic-matrix composites are laminated on a macroscopic scale with sheets of unreinforced materials or dissimilar sheets of metal composites so that the completed laminate has attributes traceable to both constituent sheets. Such laminates have significantly greater interlayer distances than might be desirable for structural considerations alone and they are significantly anisotropic, being the product of laminated sheets.

SUMMARY OF THE INVENTION

This invention provides a method for producing structural metal composites with microlaminated non-monolithic layered matrices. The invention is particularly concerned with:

(a) improving the crack growth resistance of metal composites based upon conventional matrix alloys by incorporation of crack stopping or deviating layers, and (b) imparting ductility to hard but brittle materials such as intermetallic materials which have desirable attributes but are otherwise too brittle or unsuitable in some other way when used in conventional manner.

For example, the crack growth resistance of metal composites in which the matrix is a conventional titanium alloy might be improved by incorporating layers of a brittle material such as a ceramic or intermetallic material as microlayers within the conventional matrix alloy. In another example, titanium intermetallic materials might be modified to permit some degree of deformation before failure by incorporating microlayers of a more ductile material within the otherwise brittle matrix. Such a modification would compensate for the notorious lack of ductility at ambient temperatures of the titanium intermetallics which undermines their potential for use as matrix materials in compressor components of advanced aero gas turbine engines on the basis of their favourable creep resistance properties at high temperatures.

The invention further provides a viable route to the production of structural composites having a microlaminated non-monolithic matrix comprising a matrix material which is a metal, an intermetallic, or an alloy, by the use of precursor products in the form of reinforcement fibres precoated with the matrix material to the degree required to yield the desired matrix volume fraction in a consolidated product, wherein the matrix material is present upon the fibres as a series of successive microlayers in concentric rings.

One aspect of the claimed invention comprises a method of making a long fibre ceramic reinforcement precoated with matrix material, as a precursor for subsequent consolidation to yield a structural composite, the method comprising:

a) depositing upon the ceramic fibre a first layer comprising a first matrix material;

b) depositing upon the first layer coated fibre a second layer comprising a second matrix material;

c) depositing upon the second layer coated fibre a third layer comprising said first matrix material, and d) optionally depositing a further layer comprising said second matrix material or further layers comprising said second and first matrix materials in alternating sequence;

wherein:

i) said first matrix material is a metal, an alloy or an intermetallic material;

ii) said first or said second matrix material is substantially more ductile than the other of said matrix materials;

iii) the layers of said first matrix material are deposited upon the fibre from the vapour phase by condensation or sputtering or by chemical vapour reaction;

iv) the layer or layers of said second matrix material are deposited upon the fibre from the vapour phase by condensation or sputtering or by chemical vapour reaction or otherwise created by in situ reaction, and v) the aforementioned layers aggregate to a total coating thickness of at least 5% of fibre radius sufficient to yield a composite material of a desired matrix volume fraction without further addition of matrix material upon consolidation together of a plurality of like precoated fibres.

A matrix coating of around 5% of fibre radius is near the minimum required to yield a fully dense composite upon consolidation in the manner intended without the need for additional matrix material. Even at this minimal thickness, the matrix coating thickness is considerably greater than will be present on prior art fibres provided with barrier or similar coatings for use in conjunction with separately provided matrix material such as metal foils.

The second matrix material may be of the nature of a frangible layer between layers of a conventional matrix alloy such as a titanium based alloy or an aluminum based alloy. This lends increased resistance against the propagation of cracks through the matrix by disrupting through-layer crack paths and by absorbing crack propagation energy. The frangible layers can be of appreciable thickness or else of minimal thickness sufficient to prevent unifying diffusion bonding of adjacent layers of the principal matrix material.

Alternatively the first matrix material may be an intermetallic material and the second matrix material a more ductile metal or alloy. In matrix-coated fibres produced to this format, the microlayers of the second matrix material will have a thickness of the same order of magnitude as the layers of the first matrix material.

Preferably there are deposited at least ten each of said first and said second layers and these aggregate to a coating thickness of at least 20% of the fibre radius.

The reinforcement fibre may be a silicon carbide fibre or any other variety of commercially available ceramic fibre.

The respective first and second matrix materials are chosen such that the combination yields an improvement in matrix properties over that which would be obtained using either material on its own. Accordingly, the individual materials should be selected as pairs, rather than independently, so that the appropriate characteristics ape combined. Some preferred pairings of matrix materials are given below.

| FIRST MATRIX MATERIAL | SECOND MATRIX MATERIAL |
|---|---|
| TYPE "A" SYSTEMS WITH CRACK STOPPING INTERLAYERS | |
| aluminum alloy or titanium alloy | metal oxides, borides, nitrides or carbides; e.g. $Y_2O_3$, TiN, $B_4C$, SiC, TiB or $SiO_2$ intermetallic compounds; e.g. $Ti_3Al$ or TiAl |
| TYPE "B" SYSTEMS WITH BRITTLE MATRIX SYSTEMS | |
| intermetallic compounds e.g. $Ti_3Al$ or Ti Al | titanium or cobalt alloy or Zr, Nb, Mo or W |

The second matrix material in the Type "A" system may be obtained by reaction of previously deposited material with oxygen or other elements present in the deposited matrix or in an enveloping environment. In the finished structural composite product the second matrix material is dissimilar in nature to the first matrix material in order to convey the improved damaged tolerance with which this invention is concerned. This differential may be achieved through in situ reaction of previously-deposited materials when an assembly of the matrix coated fibres is consolidated under pressure and at elevated temperature to product form. For example, a product precursor may be produced by the claimed method which consists of aluminum alloy primary matrix material with titanium secondary matrix material such that upon consolidation to product form the titanium will react with the aluminum alloy to yield a layer of titanium aluminides.

The invention also provides a method of making an article comprising a metal matrix composite material by consolidating under heat and pressure an assembly of the precoated fibres produced in any of the ways previously disclosed.

BRIEF DESCRIPTION OF THE DRAWINGS

The invention will now be described by way of example with reference to the drawings, in which.

DETAILED DISCUSSION OF PREFERRED EMBODIMENTS

Figure 1:
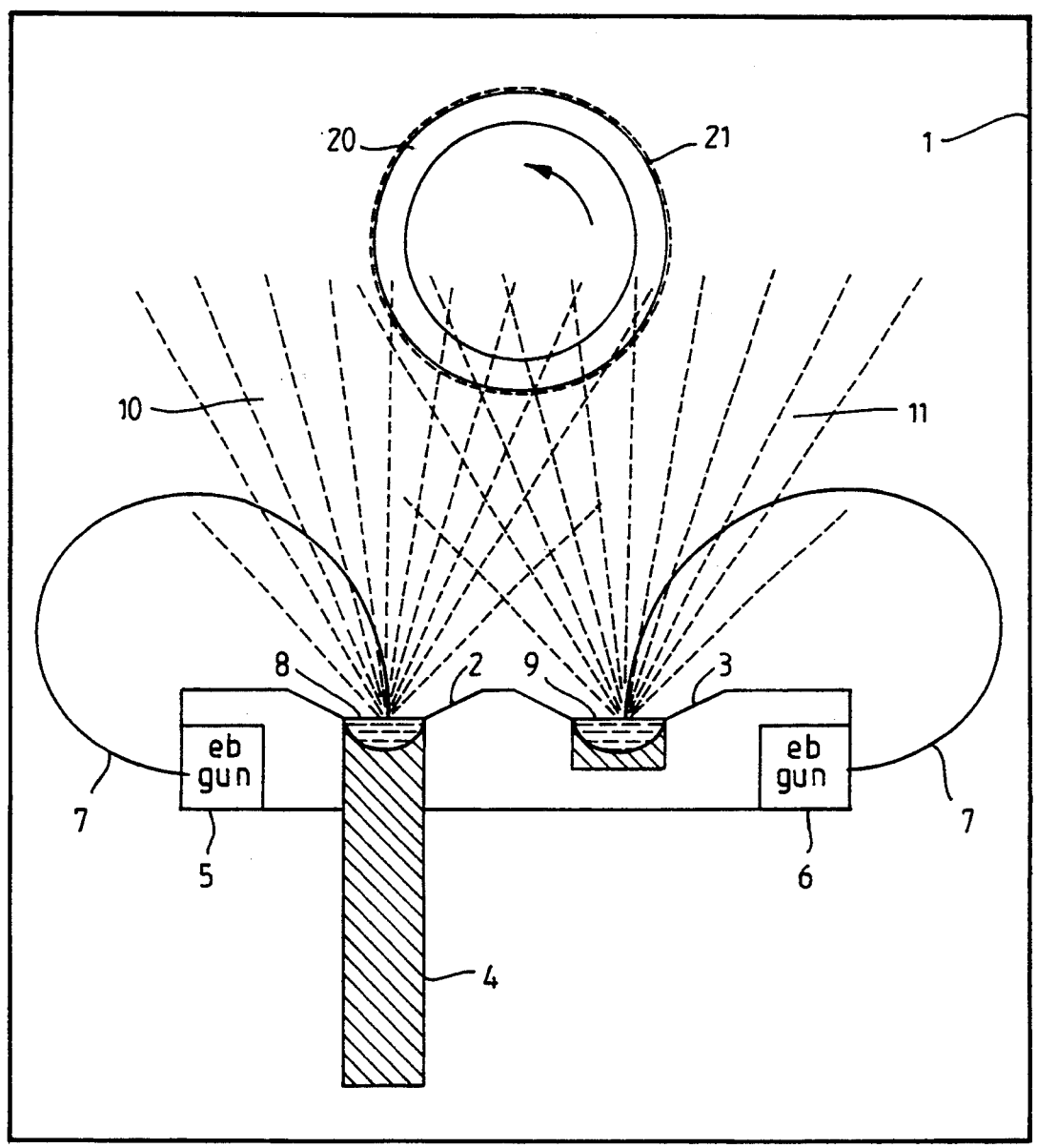
FIG. 1 is a schematic representation of a dual source fibre coating cell.

The fibre coating cell depicted in the drawings is of a vapour evaporation/condensation variety and is contained within a vacuum chamber 1. The cell in FIG. 1 has two evaporation crucibles 2 and 3 formed within a common water cooled copper hearth. Crucible 2 is of open bottomed form and is continuously replenished with a rod of charge indicated at 4. This rod 4 is pushed forwards as required by a conventional screw feed mechanism (not shown). Crucible 3 is a simple well within the hearth and is charged or recharged from above. There is a respective electron beam gun (5, 6) for each crucible to heat the charge contained therein. The electron beams (indicated at 7) are steered and focused so as to impinge upon the respective charges over a wide area and the power settings of the guns 5 and 6 are controlled independently to establish melt pools 8 and 9 within the respective charges. Vapour fluxes 10 and 11 issue from crucibles 2 and 3, respectively, and these mix with each other as they rise upwards.

Figure 2:
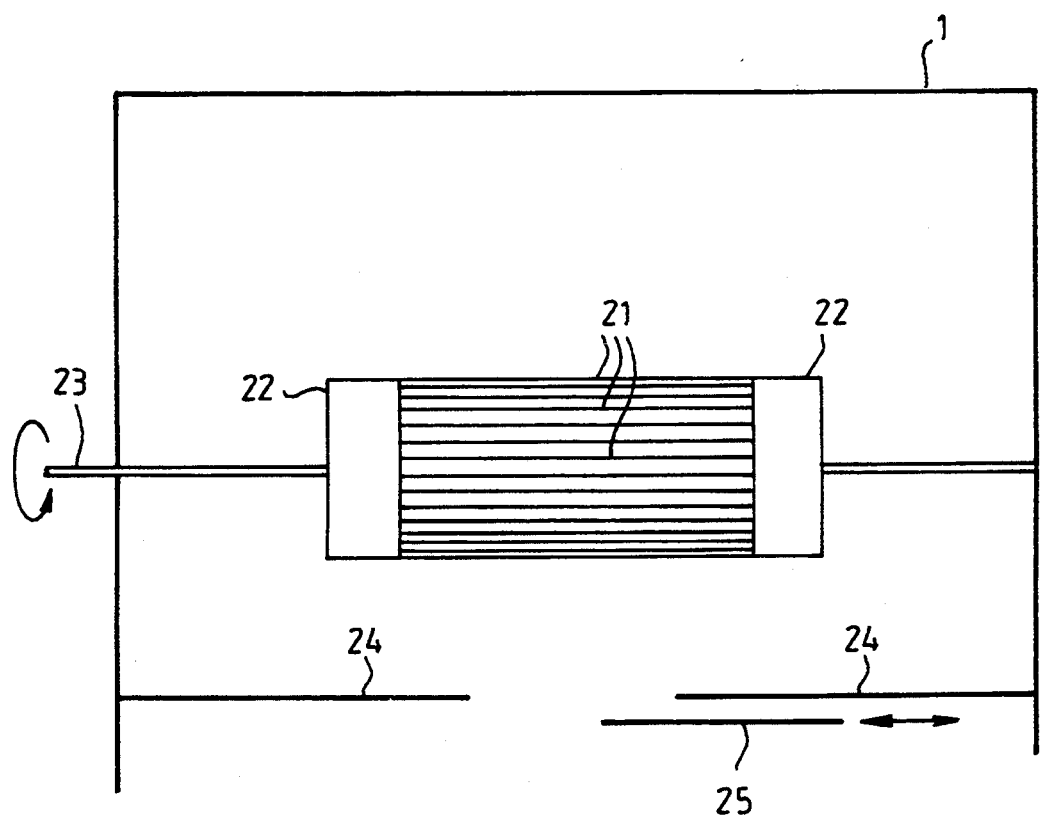
FIG. 2 is a schematic partial view from an orthogonal aspect showing the rotatable drum assembly.

Above the evaporation crucibles 2 and 3, but still within the vacuum chamber 1, there is a rotatable drum assembly 20 upon which are mounted lengths 21 of ceramic fibres for coating in the manner of the invention. The drum assembly is indicated more clearly in FIG. 2. It comprises two spools 22 mounted in a spaced apart manner upon a rotatable shaft 23. The individual ceramic fibres 21 are strung between the spools 22 around the periphery in the manner of a "squirrel cage" such that rotation of the drum 20 causes all lateral surfaces of the fibres 21 to be exposed in a direct line of sight to the vapour fluxes 10 and 11 at some point during the drum's rotation. There are also screens 24 and a shutter 25. The former serve to avoid deposition of coating material upon the structure and fittings of the vacuum chamber 1. The shutter 25 serves to close off the fibres 21 from the fluxes 10 and 11 of coating vapours to avoid deposition on the fibre at conditions other than equilibrium conditions.

The rod source 4 can be any evaporable metal or alloy. In the case of an alloy, any differences in vapour pressure between its constituent elements at the temperature of the melt pool will be reflected in the relative abundance of species in the flux of vapours. This means that the vapour mix will contain different proportions of ingredients from the melt pool 8. In the steady state, however, the melt pool is enriched with the less volatile ingredient or ingredients to a degree which enables the vapour mix to match the composition of the rod source.

The apparatus depicted schematically in the Figures can be operated either for simultaneous evaporation of species from the two evaporation crucibles (as shown and described above) or for sequential evaporation of respective species. In the former case a deposition in sequence of dissimilar layers of matrix material is achieved by closing down the equipment and replacing charge material between each layer of deposition. This level of complexity might be required for example when depositing a layer of intermetallic material which requires the individual elements of the intermetallic material to be evaporated simultaneously from respective evaporation crucibles.

For the alternative sequential mode of deposition, two dissimilar matrix materials can be deposited as layers upon the fibres 21 in alternating sequence by alternating operation of the electron beam In a form of apparatus suitable for continuous coating of reinforcement with alternating layers of different matrix types, a single vacuum chamber might accommodate a single fibre coating cell, or a plurality of cells for each matrix type. These can be of either form described but with some different arrangement for drawing and rotating the reinforcement fibre on a continuous basis through the series of coating cells. This arrangement can be generally of the form described in our co-pending PCT application WO 92/14680, but lengthened to the degree necessary to accommodate at least two evaporation crucibles between the end rollers.

The invention is described further below with reference to several examples thereof:

EXAMPLE 1

A matrix coated fibre precursor for a metal matrix composite was produced using the equipment as described above to coat a 145 $\mu$m Textron silicon carbide fibre with alternating layers of aluminum and titanium starting and finishing with an aluminum layer. The aluminum layers were produced by evaporating a rod source of commercial purity aluminum from crucible 2. The power setting of electron beam gun 5 was 4.5 kW and each period of aluminum deposition lasted 6 minutes. Shutter 25 was kept in the closed position prior to the first layer of deposition until the evaporation had stabilised.

The titanium layers were produced by evaporation of commercial purity titanium from crucible 3. The power setting of electron beam gun 6 was 3.5 kW and each period of titanium deposition lasted for 5 seconds. At each changeover from aluminum deposition to titanium deposition and vice versa the shutter 25 was closed before shutting off the running electron beam gun. Shutter 25 was not reopened until the other electron beam gun had been switched on and had reached a steady state.

At the end of the last layer of matrix deposition the shutter 25 was closed before switching off the then running electron beam gun.

The vacuum chamber was evacuated to around $5 \times 10^{-5}$ torr prior to the start of deposition and the vacuum chamber pump was kept running throughout the coating process to maintain a good vacuum. The drum was rotated at a steady rate of 5 rpm. This process produced a coated fibre with 5 $\mu$m layers of aluminum interspersed with 0.5 $\mu$m layers of titanium. A total of 8 aluminum layers and seven titanium layers were deposited. The total coating thickness on the 145 $\mu$m diameter fibre aggregated to approximately 43.5 $\mu$m which would yield a fibre volume fraction of approximately 28% in a consolidated product.

A metal matrix composite was created from the matrix coated ceramic fibres by assembling a bunch of these and consolidating them. This was accomplished by hot pressing in a die for 2 hours at 500° C. and 100 MPa die pressure. A fully dense metal matrix composite with a recognisable laminated-ring based matrix microstructure was created by this consolidation. The outer layers of matrix coating flowed under the consolidation regime to fill all interstices and the various matrix coatings diffusion bonded together to unite the individual matrix coated fibres together in a unitary composite product.

EXAMPLE 2

A matrix coated fibre precursor for a metal matrix composite was produced by using the equipment described previously to coat a Sigma silicon carbide fibre of 100 $\mu$m diameter with alternating layers of an aluminum alloy and titanium, starting with the former. The aluminum alloy had the nominal composition by weight of 7.5% Cr-1.2% Fe and remainder Al. This is a known evaporation route alloy with good strength and elevated temperature properties. The aluminum alloy was deposited from a pre-alloyed rod source of the same composition.

Apart from changes in power settings and the duration of deposition periods, the coating process was the same as that described above for Example 1 except that the titanium was evaporated from crucible 3 and the aluminum alloy was evaporated from crucible 2.

For this example, both the electron beam guns 5 and 6 were run at 3 kW and the coating periods were 3 minutes for the aluminum alloy and 15 seconds for the titanium. A total of 15 layers of aluminum alloy and 14 layers of titanium were deposited. The aluminum alloy layers were approximately 2 $\mu$m thick and the titanium layers approximately 0.5 $\mu$m thick so that the aggregate coating thickness on the 100 $\mu$m fibre was 36.5 $\mu$m. This would yield upon consolidation a metal matrix composite with a fibre volume fraction of approximately 33.5%.

This product precursor is intended to yield a product upon consolidation in which the matrix is predominantly of the aluminum alloy but is interspersed with layers of frangible crack stopping layers of titanium aluminides formed by reaction at the temperature of the consolidation regime between the originating titanium layers and aluminum from adjoining layers of aluminum alloy.

EXAMPLE 3

A matrix coated fibre precursor for a metal matrix composite was produced using the equipment described previously to coat a Sigma silicon carbide fibre of 100 $\mu$m diameter with alternating layers of titanium and yttrium, starting with the former. The titanium was evaporated from a rod source in crucible 2 and the yttrium from crucible 3. The power setting of electron beam gun 5 was 3 kW and for electron beam gun 6 was 1 kW. The deposition intervals were 1 minute for each titanium deposition and 15 seconds for each yttrium deposition. The vacuum chamber pressure and the rotation rate of the drum 20 were as before.

Figure 3:
FIG. 3 is a microsectional view of a product precursor, matrix coated fibre.

This deposition regime yielded layer thicknesses of approximately 2 μm for the titanium layers and approximately 0.5 μm for the yttrium layers. A total of 12 layers of titanium and 11 of yttrium were deposited upon the fibre to produce a product precursor comprising a 100 μm fibre with an aggregate coating thickness of 31.5 μm. This product precursor would yield a fibre volume fraction of approximately 37% when consolidated to product. A microsectional view of this coated fibre is given in FIG. 3, in which the titanium layers appear as the darker bands.

This particular product precursor is intended to yield a matrix of titanium layers interspersed with frangible yttria layers when consolidated to product form. The yttria is formed by reaction of yttrium with oxygen present in the titanium matrix layers at the temperature of the consolidation regime. The presence of such frangible yttria layers is expected to yield significantly improved damage tolerance in the product material in comparison with a similar composite having a monolithic titanium matrix.

Figure 4:
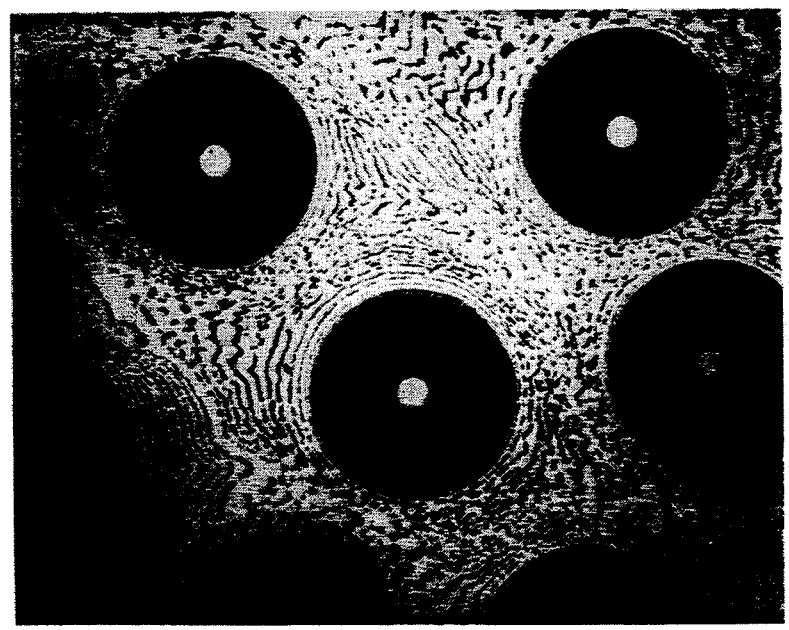
FIG. 4 is a microsectional view of a metal composite produced from the product precursor depicted in FIG. 3.

A metal matrix composite was created from the matrix coated fibre by assembling a bunch of these and consolidating them by hot pressing in a die for 2 hours at 925° C. and 50 MPa die pressure. The product metal matrix composite is depicted in microsectional view in FIG. 4. In this Figure the yttria layers ape seen as the darker bands between the fibres.

We claim:

1. A method of precoating ceramic fibers with matrix material, as a precursor for subsequent consolidation to yield a structural composite, the method comprising:
    a) depositing upon the ceramic fiber a first layer comprising a first matrix material;
    b) depositing upon the first layer coated fiber at least a second layer comprising a second matrix material;
    c) depositing upon the second layer coated fiber a third layer comprising said first matrix material, and
    d) optionally depositing further layers comprising said second matrix material and said first matrix materials in alternating sequence; wherein:
        i) said first matrix material is one of a metal, an alloy and an intermetallic material;
        ii) one of said first and second matrix materials is substantially more ductile than the other of said first and second matrix materials;
        iii) the layers of said first matrix material are deposited upon the fiber from the vapour phase by one of condensation, sputtering and by chemical vapour reaction;
        iv) the at least one layer of said second matrix material is deposited upon the fiber from the vapour phase by one of condensation, sputtering and chemical vapour reaction, and
        v) the aforementioned layers aggregate to a total coating thickness of at least 5% of fiber radius and are sufficient to yield a composite material of a matrix volume fraction without further addition of matrix material upon consolidation together of a plurality of like precoated fibers.

2. A method as claimed in claim 1 in which the second matrix material is a frangible material and the layers thereof are substantially thinner than the layers of the first matrix material.

3. A method as claimed in claim 1 in which the first matrix material is an intermetallic material and the second matrix material is a ductile metal or alloy.

4. A method as claimed in claim 1 in which at least ten layers each of the first matrix material and the second matrix material are deposited upon the ceramic reinforcement fiber and in which these aggregate to a coating thickness of at least 20% of the fiber radius.

5. A method of making a metal matrix composite article, comprising consolidating under heat and pressure an assembly of precoated ceramic fibers produced according to a method as claimed in claim 1.

6. A method as claimed in claim 5 in which the second matrix material is a metal present on the precoated fibers in layers which are thin in relation to the layers of first matrix material, and the first matrix material is a metal or alloy; wherein the temperature and duration of the consolidation step are sufficient to produce reaction between the first and second matrix materials to yield at least one intermetallic compound material present in at least one layer between the layers of the first matrix material.

7. A method as claimed in claim 1, wherein prior to any aggregation of fibers step, said at least one layer of said second matrix material is modified after deposition of said second matrix material on said fiber.

8. A method of manufacturing a composite product, comprising the steps of:
    precoating ceramic fibers with matrix material, as a precursor for subsequent consolidation to yield said composite product, said precoating step comprising:
    a) depositing upon the ceramic fiber a first layer comprising a first matrix material:
    b) depositing upon the first layer coated fiber at least a second layer comprising a second matrix material;
    c) depositing upon the second layer coated fiber a third layer comprising said first matrix material, and
    d) optionally depositing further layers comprising said second matrix material and said first matrix materials in alternating sequence; wherein:
        i) said first matrix material is one of a metal, an alloy and an intermetallic material;
        ii) one of said first and second matrix materials is substantially more ductile than the other of said first and second matrix materials;
        iii) the layers of said first matrix material are deposited upon the fiber from the vapour phase by one of condensation, sputtering and by chemical vapour reaction;
        iv) the at least one layer of said second matrix material is deposited upon the fiber from the vapour phase by one of condensation, sputtering and chemical vapour reaction; and
        v) the aforementioned layers aggregate to a total coating thickness of at least 5% of fiber radius;
    assembling a plurality of said precoated fibers; and
    consolidating, without further addition of matrix material, said plurality of precoated fibers to yield said composite product.

9. A method of manufacturing a composite product according to claim 8, wherein said consolidating step comprises compressing said precoated fibers.

10. A method of manufacturing a composite product according to claim 8, wherein said consolidating step comprises heating said precoated fibers.

11. A method of manufacturing a composite product according to claim 8, wherein said consolidating step comprises hot pressing said precoated fibers.

12. A method of manufacturing a composite product according to claim 11, wherein said consolidating step comprises heating said precoated fibers to 925° C. and compressing said precoated fibers with a pressure of 50 MPa.

13. A method of manufacturing a composite product according to claim 8, wherein said assembling step comprises assembling said precoated fibers in a die.

14. A method of manufacturing a composite product according to claim 13, wherein said consolidating step comprises heating said precoated fibers to 925° C. and compressing said precoated fibers with a die pressure of 50 MPa.

* * * * *